(12) United States Patent
Huang et al.

(10) Patent No.: US 11,963,409 B2
(45) Date of Patent: Apr. 16, 2024

(54) ARRAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Weiyun Huang, Beijing (CN); Yue Long, Beijing (CN); Chao Zeng, Beijing (CN); Meng Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 82 days.

(21) Appl. No.: 17/584,475

(22) Filed: Jan. 26, 2022

(65) Prior Publication Data
US 2022/0149142 A1 May 12, 2022

Related U.S. Application Data

(63) Continuation of application No. 17/256,197, filed as application No. PCT/CN2019/118675 on Nov. 15, 2019.

(51) Int. Cl.
*H01L 27/32* (2006.01)
*H10K 59/121* (2023.01)
*H10K 59/131* (2023.01)

(52) U.S. Cl.
CPC ....... *H10K 59/131* (2023.02); *H10K 59/1213* (2023.02)

(58) Field of Classification Search
None
See application file for complete search history.

(56) References Cited

U.S. PATENT DOCUMENTS

2005/0184672 A1* 8/2005 Lee ............... H10K 59/1315
315/169.3
2006/0044237 A1* 3/2006 Lee ..................... G09G 3/3233
345/82
(Continued)

FOREIGN PATENT DOCUMENTS

CN 109713012 A * 5/2019 ............ G09G 3/20
JP 2007041561 A 2/2007
(Continued)

OTHER PUBLICATIONS

Notice of Reasons for Refusal of Japanese application No. 2021-538351 issued on Aug. 8, 2023.
(Continued)

*Primary Examiner* — Robert K Carpenter
(74) *Attorney, Agent, or Firm* — Lippes Mathias LLP

(57) ABSTRACT

The present disclosure provides an array substrate and a display device. The array substrate includes: a sub-pixel, in a display region and including a light-emitting element, the light-emitting element including a first electrode, a light-emitting layer and a second electrode; a positive power line, connected to the first electrode; a positive power bus, connected to the positive power line; three positive power access ends, at a side of the positive power bus away from a display region, and respectively connected to the positive power bus; a negative power line; an auxiliary electrode, respectively connected to the negative power line and the second electrode; three negative power access ends, at the side of the positive power bus away from the display region, and respectively connected to the negative power line; and a negative power auxiliary line, respectively connected to the negative power access end and the auxiliary electrode.

20 Claims, 10 Drawing Sheets

(56) References Cited

U.S. PATENT DOCUMENTS

| | | |
|---|---|---|
| 2007/0024181 A1 | 2/2007 | Oh |
| 2007/0146246 A1 | 6/2007 | Nakamura et al. |
| 2008/0054796 A1 | 3/2008 | Sung et al. |
| 2008/0191603 A1 | 8/2008 | Kubota |
| 2012/0057091 A1* | 3/2012 | Kawabata ................ H04N 5/66 349/38 |
| 2014/0091992 A1 | 4/2014 | Lee et al. |
| 2015/0138466 A1* | 5/2015 | Mori ................ G02F 1/133512 349/38 |
| 2017/0033312 A1 | 2/2017 | Kim et al. |
| 2017/0162126 A1 | 6/2017 | Lee et al. |
| 2019/0279575 A1 | 9/2019 | Kim et al. |
| 2019/0288234 A1 | 9/2019 | Kim et al. |

FOREIGN PATENT DOCUMENTS

| | | |
|---|---|---|
| JP | 2007164161 A | 6/2007 |
| JP | 2007304394 A | 11/2007 |
| JP | 2008066266 A | 3/2008 |
| JP | 2008218395 A | 9/2008 |
| JP | 2009175476 A | 8/2009 |
| JP | 2014163991 A | 9/2014 |
| JP | 2015141816 A | 8/2015 |
| KR | 20150071840 A | 6/2015 |

OTHER PUBLICATIONS

Notice of Reasons for Refusal of Japanese application No. 2022-186013 issued on Sep. 5, 2023.
Notice of allowance of U.S. Appl. No. 17/256,197 issued on Aug. 22, 2023.

* cited by examiner

ARRAY SUBSTRATE AND DISPLAY DEVICE

This application is a continuation application based on U.S. application Ser. No. 17/256,197, filed on Dec. 26, 2020, which is a 371 of PCT Patent Application Serial No. PCT/CN2019/118675, filed on Nov. 15, 2019.

TECHNICAL FIELD

The present disclosure relates to the technical field of display, and in particular, to an array substrate and a display device.

BACKGROUND

With the increased size of the array substrate, the length and load of the signal transmission line out of the display region of the array substrate are also increased. In case of an overlarge impedance of the signal transmission line for transmitting the positive voltage signal (VDD) or the signal transmission line for transmitting the negative voltage signal (VSS), the pictures displayed by the array substrate tend to be non-uniform in brightness.

SUMMARY

The embodiments of the present disclosure provide an array substrate and a display device.

In one aspect, the present disclosure provides an array substrate, including:
- a base substrate, including a display region and a peripheral region surrounding the display region, the display region including a first boundary, a second boundary, a third boundary and a fourth boundary;
- a plurality of sub-pixels, located in the display region, at least one of the sub-pixels including a light-emitting element, and the light-emitting element including a first electrode, a light-emitting layer and a second electrode which are sequentially stacked;
- a plurality of positive power lines, located in the display region and electrically connected to the first electrode;
- a positive power bus, located in the peripheral region and arranged along the first boundary, the positive power bus being electrically connected to the plurality of positive power lines;
- a first positive power access end, a second positive power access end and a third positive power access end, located at a side of the positive power bus away from the display region, the second positive power access end being located between the first positive power access end and the third positive power access end, and the first positive power access end, the second positive power access end and the third positive power access end being respectively and electrically connected to the positive power bus;
- a negative power line, located in the peripheral region and surrounding the second boundary, the third boundary and the fourth boundary;
- an auxiliary electrode, located in the peripheral region and surrounding the first boundary, the second boundary, the third boundary and the fourth boundary, the auxiliary electrode being respectively and electrically connected to the negative power line and the second electrode;
- a first negative power access end, a second negative power access end and a third negative power access end, located at the side of the positive power bus away from the display region, the first negative power access end being located at a side of the first positive power access end away from the second positive power access end, the second negative power access end being located between the first positive power access end and the third positive power access end, the third negative power access end being located at a side of the third positive power access end away from the second positive power access end, and the first negative power access end and the third negative power access end being respectively and electrically connected to the negative power line; and
- a negative power auxiliary line, located in the peripheral region, located between the first positive power access end and the third positive power access end and located between the positive power bus and the second negative power access end, the negative power auxiliary line being respectively and electrically connected to the second negative power access end and the auxiliary electrode.

Optionally, the first positive power access end, the second positive power access end and the third positive power access end are used to transmit a positive voltage signal to the light-emitting element through the positive power bus, the positive power lines and the first electrode; and
the first negative power access end, the second negative power access end and the third negative power access end are used to transmit a negative voltage signal to the light-emitting element through the negative power line, the negative power auxiliary line, the auxiliary electrode and the second electrode.

Optionally, the array substrate further includes:
- a fourth positive power access end, located at the side of the positive power bus away from the display region and located between the first positive power access end and the third positive power access end, the fourth positive power access end being electrically connected to the positive power bus; and
- the fourth positive power access end is used to transmit the positive voltage signal to the light-emitting element through the positive power bus, the positive power lines and the first electrode.

Optionally, the array substrate further includes:
- a fourth negative power access end, located at the side of the positive power bus away from the display region and located between the first positive power access end and the third positive power access end, the fourth negative power access end being electrically connected to the negative power auxiliary line; and
- the fourth negative power access end is used to transmit the negative voltage signal to the light-emitting element through the negative power auxiliary line, the auxiliary electrode and the second electrode.

Optionally, the second negative power access end is located between the second positive power access end and the third positive power access end, and the array substrate further includes:
- a fourth positive power access end and a fourth negative power access end, located at the side of the positive power bus away from the display region, the fourth positive power access end being located between the second negative power access end and the third positive power access end and electrically connected to the positive power bus, and the fourth negative power access end being located between the second negative power access end and the fourth positive power access end and electrically connected to the negative power auxiliary line; and the fourth positive power access end is used to transmit the positive voltage signal to the light-emitting element through the positive power bus, the positive power lines and the first electrode, and the fourth negative power access end is used to transmit the negative voltage signal to the light-emitting element through the negative power auxiliary line, the auxiliary electrode and the second electrode.

Optionally, at least one of the sub-pixels includes a thin film transistor and a connecting electrode; and the thin film transistor includes an active layer located on the base substrate, a gate located at a side of the active layer away from the base substrate, and a source and a drain which are located at a side of the gate away from the base substrate.

Optionally, the positive power bus includes a first sublayer of the positive power bus and a second sublayer of the positive power bus, and the first sublayer of the positive power bus is electrically connected to the second sublayer of the positive power bus; and the first sublayer of the positive power bus and the source or the drain are located in the same layer, and the second sublayer of the positive power bus and the connecting electrode are located in the same layer.

Optionally, the first sublayer of the positive power bus is electrically connected to the second sublayer of the positive power bus through a positive power bus via hole.

Optionally, the negative power line includes a first sublayer of the negative power line and a second sublayer of the negative power line, and the first sublayer of the negative power line is electrically connected to the second sublayer of the negative power line;

the negative power auxiliary line includes a first sublayer of the negative power auxiliary line and a second sublayer of the negative power auxiliary line, and the first sublayer of the negative power auxiliary line is electrically connected to the second sublayer of the negative power auxiliary line; and the first sublayer of the negative power line and the first sublayer of the negative power auxiliary line are both located in the same layer with the source or the drain, and the second sublayer of the negative power line and the second sublayer of the negative power auxiliary line are both located in the same layer with the connecting electrode.

Optionally, the first sublayer of the negative power line is electrically connected to the second sublayer of the negative power line through a negative power line via hole, and the first sublayer of the negative power auxiliary line is electrically connected to the second sublayer of the negative power auxiliary line through a negative power auxiliary line via hole.

Optionally, at least one of the sub-pixels includes a thin film transistor;

the thin film transistor includes an active layer located on the base substrate, a gate located at a side of the active layer away from the base substrate, and a source and a drain which are located at a side of the gate away from the base substrate; and the first positive power access end, the second positive power access end, the third positive power access end and the fourth positive power access end are all located in the same layer with the source or the drain.

Optionally, at least one of the sub-pixels includes a thin film transistor;

the thin film transistor includes an active layer located on the base substrate, a gate located at a side of the active layer away from the base substrate, and a source and a drain which are located at a side of the gate away from the base substrate; and the first negative power access end, the second negative power access end, the third negative power access end and the fourth negative power access end are all located in the same layer with the source or the drain.

Optionally, the negative power auxiliary line includes a first sublayer of the negative power auxiliary line and a second sublayer of the negative power auxiliary line, and the first sublayer of the negative power auxiliary line is electrically connected to the second sublayer of the negative power auxiliary line; and the second negative power access end, the fourth negative power access end and the first sublayer of the negative power auxiliary line are of an integral structure.

Optionally, the array substrate further includes:

a circuit board, located at sides, away from the display region, of the first positive power access end, the second positive power access end, the third positive power access end, the fourth positive power access end, the first negative power access end, the second negative power access end, the third negative power access end and the fourth negative power access end, wherein the first positive power access end, the second positive power access end, the third positive power access end, the fourth positive power access end, the first negative power access end, the second negative power access end, the third negative power access end and the fourth negative power access end are respectively and electrically connected to the circuit board.

Optionally, the auxiliary electrode is located at a side of the negative power line away from the base substrate, and the auxiliary electrode is electrically connected to the negative power auxiliary line through a negative power auxiliary via hole.

Optionally, the light-emitting element is an Organic Light Emitting Diode (OLED), the first electrode serves as an anode, and the second electrode serves as a cathode.

In another aspect, the present disclosure provides a display device, including any array substrate in the foregoing aspect.

DETAILED DESCRIPTION

Figure 1:
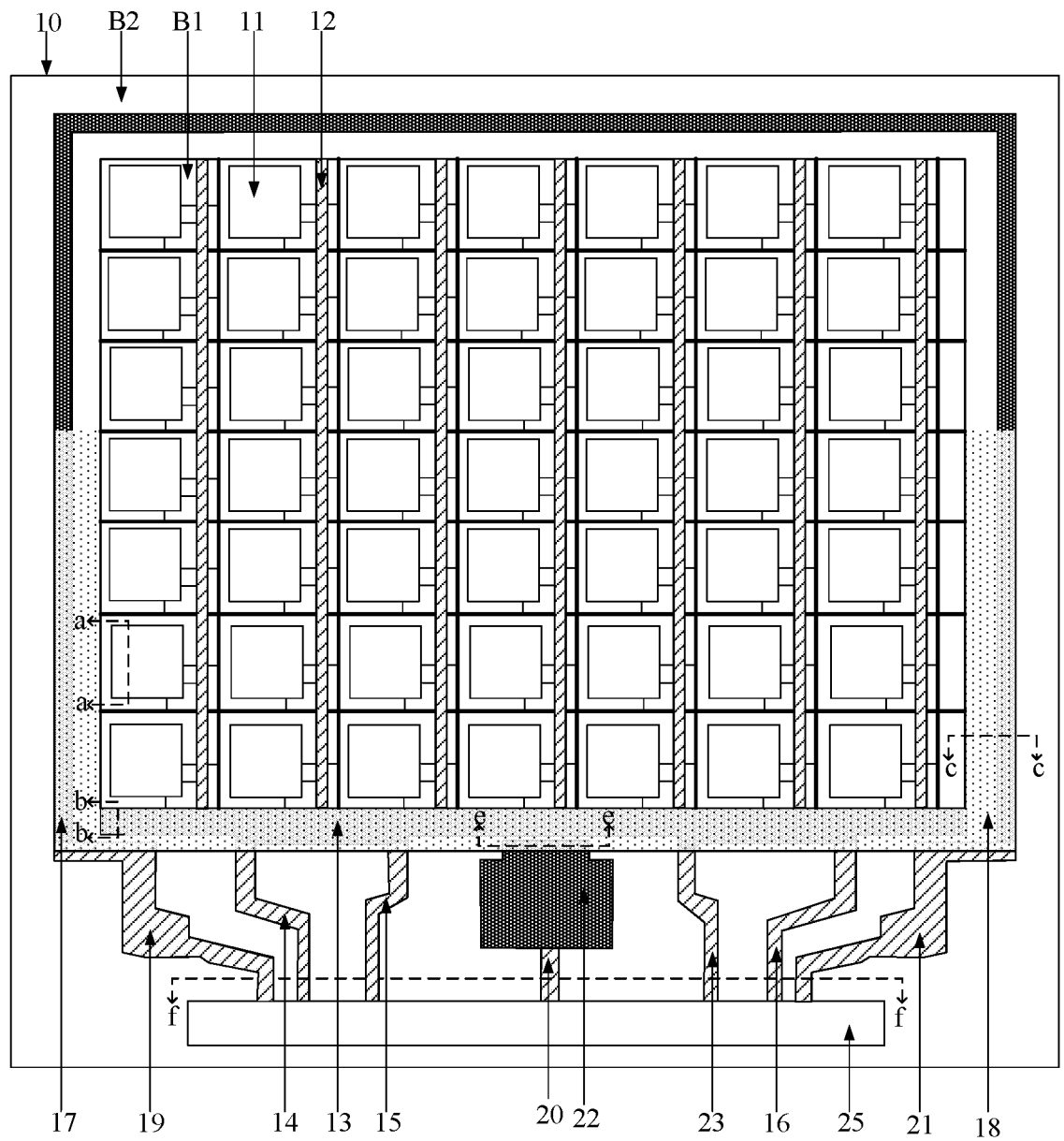
FIG. 1 is a front view of an array substrate provided by an embodiment of the present disclosure.

To make the principles, technical solutions, and advantages of the present disclosure clearer, the implementation manners of the present disclosure are described below in detail with reference to the accompanying drawings.

An embodiment of the present disclosure provides an array substrate. In the array substrate, both the signal transmission line for transmitting the positive voltage signal to the sub-pixel and the signal transmission line for transmitting the negative voltage signal to the sub-pixel have a small impedance, which is helpful to improve the condition that the pictures displayed by the array substrate are non-uniform in brightness easily, and ensure the uniformity of brightness of the pictures displayed by the array substrate.

In the embodiment of the present disclosure, the array substrate includes:
- a base substrate, including a display region and a peripheral region surrounding the display region, the display region including a first boundary, a second boundary, a third boundary and a fourth boundary;
- a plurality of sub-pixels, located in the display region, at least one of the sub-pixels including a light-emitting element, and the light-emitting element including a first electrode, a light-emitting layer and a second electrode which are sequentially stacked;
- a plurality of positive power lines, located in the display region and electrically connected to the first electrode;
- a positive power bus, located in the peripheral region and arranged along the first boundary, the positive power bus being electrically connected to the plurality of positive power lines;
- a first positive power access end, a second positive power access end and a third positive power access end, located at a side of the positive power bus away from the display region, the second positive power access end being located between the first positive power access end and the third positive power access end, and the first positive power access end, the second positive power access end and the third positive power access end being respectively and electrically connected to the positive power bus;
- a negative power line, located in the peripheral region and surrounding the second boundary, the third boundary and the fourth boundary;
- an auxiliary electrode, located in the peripheral region and surrounding the first boundary, the second boundary, the third boundary and the fourth boundary, the auxiliary electrode being respectively and electrically connected to the negative power line and the second electrode;
- a first negative power access end, a second negative power access end and a third negative power access end, located at the side of the positive power bus away from the display region, the first negative power access end being located at a side of the first positive power access end away from the second positive power access end, the second negative power access end being located between the first positive power access end and the third positive power access end, the third negative power access end being located at a side of the third positive power access end away from the second positive power access end, and the first negative power access end and the third negative power access end being respectively and electrically connected to the negative power line; and
- a negative power auxiliary line, located in the peripheral region, located between the first positive power access end and the third positive power access end and located between the positive power bus and the second negative power access end, the negative power auxiliary line being respectively and electrically connected to the second negative power access end and the auxiliary electrode.

Optionally, the first positive power access end, the second positive power access end and the third positive power access end are used to transmit a positive voltage signal to the light-emitting element through the positive power bus, the positive power lines and the first electrode; and the first negative power access end, the second negative power access end and the third negative power access end are used to transmit a negative voltage signal to the light-emitting element through the negative power line, the negative power auxiliary line, the auxiliary electrode and the second electrode.

Exemplarily, referring to FIG. 1 to FIG. 4, FIG. 1 to FIG. 4 illustrate front views of four array substrates provided by the embodiment of the present disclosure. Referring to FIG. 1 to FIG. 4, the array substrate includes:
- a base substrate 10, including a display region B1 and a peripheral region B2 surrounding the display region B1, and the display region B1 including a first boundary (not labeled in FIG. 1 to FIG. 4), a second boundary (not labeled in FIG. 1 to FIG. 4), a third boundary (not labeled in FIG. 1 to FIG. 4) and a fourth boundary (not labeled in FIG. 1 to FIG. 4); and the embodiment of the present disclosure taking that the peripheral region B2 surrounds the periphery of the display region B1 as the example for description;
- a plurality of sub-pixels 11, located in the display region B1, at least one of the sub-pixels 11 including a light-emitting element (not labeled in FIG. 1 to FIG. 4), and the light-emitting element including a first electrode (not labeled in FIG. 1 to FIG. 4), a light-emitting layer (not labeled in FIG. 1 to FIG. 4) and a second electrode (not labeled in FIG. 1 to FIG. 4) which are sequentially stacked; and the plurality of sub-pixels 11 being capable of emitting light to implement a display function;
- a plurality of positive power lines 12, located in the display region B1 and electrically connected to the first electrode of the light-emitting element;
- a positive power bus 13, located in the peripheral region B2 and arranged along the first boundary of the display region B1, the positive power bus 13 being electrically connected to the plurality of positive power lines 12;
- a first positive power access end 14, a second positive power access end 15 and a third positive power access end 16, located at a side of the positive power bus 13 away from the display region B1, the second positive power access end 15 being located between the first positive power access end 14 and the third positive power access end 16, and the first positive power access end 14, the second positive power access end 15 and the third positive power access end 16 being respectively and electrically connected to the positive power bus 13;

a negative power line 17, located in the peripheral region B2 and surrounding the second boundary, the third boundary and the fourth boundary of the display region B1;

an auxiliary electrode 18, located in the peripheral region B2 and surrounding the first boundary, the second boundary, the third boundary and the fourth boundary of the display region B1, the auxiliary electrode 18 being respectively and electrically connected to the negative power line 17 and the second electrode of the light-emitting element;

a first negative power access end 19, a second negative power access end 20 and a third negative power access end 21, located at the side of the positive power bus 13 away from the display region B1, the first negative power access end 19 being located at a side of the first positive power access end 14 away from the second positive power access end 15, the second negative power access end 20 being located between the first positive power access end 14 and the third positive power access end 16, the third negative power access end 21 being located at a side of the third positive power access end 16 away from the second positive power access end 15, and the first negative power access end 19 and the third negative power access end 21 being respectively and electrically connected to the negative power line 17; and the embodiment of the present disclosure taking that the second negative power access end 20 is located between the second positive power access end 15 and the third positive power access end 16 as the example for description; and a negative power auxiliary line 22, located in the peripheral region B2, located between the first positive power access end 14 and the third positive power access end 16 and located between the positive power bus 13 and the second negative power access end 20, the negative power auxiliary line 22 being respectively and electrically connected to the second negative power access end 20 and the auxiliary electrode 18.

Optionally, the first positive power access end 14, the second positive power access end 15 and the third positive power access end 16 are used to transmit the positive voltage signal to the light-emitting element through the positive power bus 13, the positive power line 12 and the first electrode; and the first negative power access end 19, the second negative power access end 20 and the third negative power access end 21 are used to transmit the negative voltage signal to the light-emitting element through the negative power line 17, the negative power auxiliary line 22, the auxiliary electrode 18 and the second electrode.

For example, as shown in FIG. 1 to FIG. 4, in the first positive power access end 14, the second positive power access end 15 and the third positive power access end 16, each positive power access end is used to transmit, through the positive power bus 13, the positive power line 12 and the first electrode that is electrically connected to the positive power line 12, the positive voltage signal to the light-emitting element where the first electrode is located. The positive voltage signal on each positive power access end may be transmitted to the positive power line 12 proximal to the positive power access end through the positive power bus 13, thereby transmitting to the light-emitting element electrically connected to the positive power line 12. For example, the positive voltage signals on the first positive power access end 14 and the third positive power access end 16 may be transmitted, through the positive power bus 13, to the light-emitting elements electrically connected to the positive power lines 12 on left and right sides (the left and right sides of a placement position shown in FIG. 1 to FIG. 4), and the positive voltage signal on the second positive power access end 15 may be transmitted, through the positive power bus 13, to the light-emitting element electrically connected to the positive power line 12 in a central region (the central region of the placement region shown in FIG. 1 to FIG. 4). In this way, the path through which the positive voltage signal transmitted from the positive power access end to the light-emitting element passes is short, and the signal transmission line for transmitting the positive voltage signal to the light-emitting element is short and has a small impedance, which is helpful to ensure the uniformity of brightness of the pictures displayed by the array substrate.

It can be understood by the persons skilled in the art that the first positive power access end 14, the second positive power access end 15 and the third positive power access end 16 simultaneously transmit the positive voltage signal to the light-emitting elements of all sub-pixels in the array substrate, and only the first positive power access end 14 and the third positive power access end 16 are proximal to the light-emitting elements on the left and right sides such that the path through which the positive voltage signal transmitted from the first positive power access end 14 and the third positive power access end 16 to the light-emitting elements on the left and right sides passes is short and the impedance is small, and the second positive power access end 15 is proximal to the light-emitting element in the central region such that the path through which the positive voltage signal transmitted from the second positive power access end 15 to the light-emitting element in the central region is short and the impedance is small.

For example, as shown in FIG. 1 to FIG. 4, each negative power access end of the first negative power access end 19 and the third negative power access end 21 is used to transmit the negative voltage signal to the light-emitting element through the negative power line 17, the auxiliary electrode 18 and the second electrode, and the second negative power access end 20 is used to transmit the negative voltage signal to the light-emitting element through the negative power auxiliary line 22, the auxiliary electrode 18 and the second electrode. The negative voltage signals on the first negative power access end 19 and the third negative power access end 21 may be transmitted, through the negative power line 17 and the auxiliary electrode 18, to the light-emitting elements on the left and right sides (the left and right sides of the placement position shown in FIG. 1 to FIG. 4), and the negative voltage signal on the second negative power access end 20 may be transmitted, through the negative power auxiliary line 22 and the auxiliary electrode 18, to the light-emitting element in the central region (the central region of the placement position shown in FIG. 1 to FIG. 4). Therefore, the path through which the negative voltage signal transmitted from the negative power access end to the light-emitting element passes is short, and the signal transmission line for transmitting the negative voltage signal to the light-emitting element is short and has a small impedance, which is helpful to ensure the uniformity of brightness of the pictures displayed by the array substrate.

It can be understood by the persons skilled in the art that the first negative power access end 19, the second negative power access end 20 and the third negative power access end 21 simultaneously transmit the negative voltage signal to the light-emitting elements of all sub-pixels in the array substrate, and only the first negative power access end 19 and the third negative power access end 21 are proximal to the light-emitting elements on the left and right sides such that the path through which the negative voltage signal transmitted from the first negative power access end 19 and the third negative power access end 21 to the light-emitting elements on the left and right sides passes is short and the impedance is small, and the second negative power access end 20 is proximal to the light-emitting element in the central region such that the path through which the positive voltage signal transmitted from the second negative power access end 20 to the light-emitting element in the central region passes is short and the impedance is small.

In summary, according to the array substrate provided by the embodiment of the present disclosure, the array substrate includes the first positive power access end, the second positive power access end, the third positive power access end, the first negative power access end, the second negative power access end and the third negative power access end, both the second positive power access end and the second negative power access end are located between the first positive power access end and the third positive power access end, each positive power access end may transmit the positive voltage signal to the light-emitting element of the proximal sub-pixel thereof through the positive power bus and the positive power line, and each negative power access end may transmit the negative voltage signal to the light-emitting element of the proximal sub-pixel thereof through the negative power line, the negative power auxiliary line and the auxiliary electrode; and therefore, both the signal transmission line for transmitting the positive voltage signal to the light-emitting element and the signal transmission line for transmitting the negative voltage signal to the light-emitting element are short and have the small impedance, which is helpful to ensure the uniformity of brightness of the pictures displayed by the array substrate.

Optionally, in the embodiment of the present disclosure, the array substrate further includes:
 a fourth positive power access end, located at the side of the positive power bus away from the display region and located between the first positive power access end and the third positive power access end, the fourth positive power access end being electrically connected to the positive power bus; and
 the fourth positive power access end is used to transmit the positive voltage signal to the light-emitting element through the positive power bus, the positive power lines and the first electrode.

Figure 2:
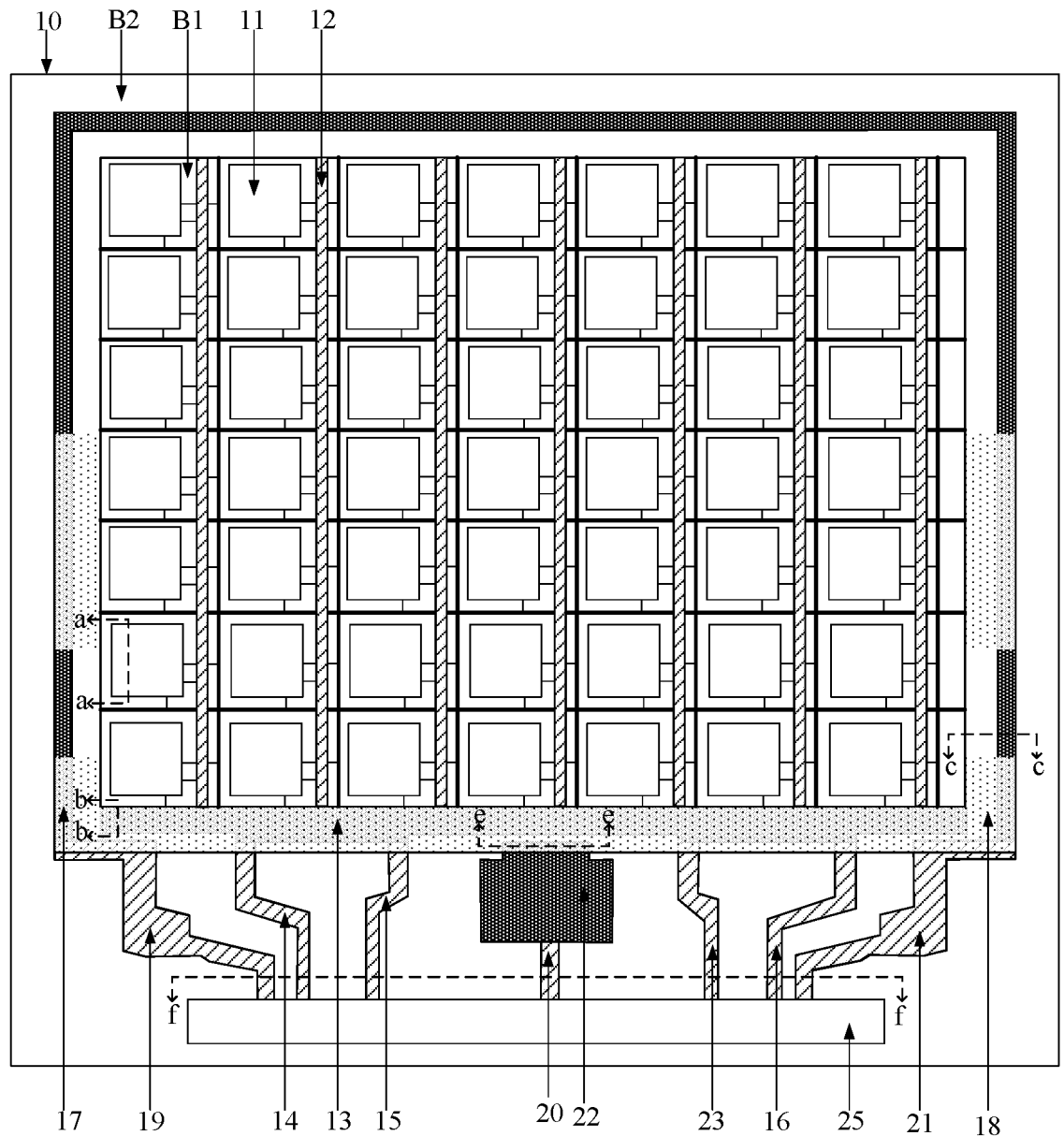
FIG. 2 is a front view of another array substrate provided by an embodiment of the present disclosure.

Exemplarily, as shown in FIG. 2, on the basis of FIG. 1, the array substrate further includes:
 a fourth positive power access end 23, located at the side of the positive power bus 13 away from the display region B1 and located between the first positive power access end 14 and the third positive power access end 16; the fourth positive power access end 23 is electrically connected to the positive power bus 13; and the fourth positive power access end 23 is used to transmit the positive voltage signal to the light-emitting element through the positive power bus 13, the positive power line 12 and the first electrode.

For example, as shown in FIG. 2, the fourth positive power access end 23 is located between the second negative power access end 20 and the third positive power access end 16, and the fourth positive power access end 23 may be symmetric to the second positive power access end 15. The positive voltage signals on the fourth positive power access end 23 and the second positive power access end 15 may be transmitted, through the positive power bus 13, to the light-emitting element electrically connected to the positive power line 12 in the central region (the central region of the placement position shown in FIG. 2). Therefore, the path through which the positive voltage signal transmitted from the positive power access end to the light-emitting element passes is short, and the signal transmission line for transmitting the positive voltage signal to the light-emitting element is short and has a small impedance, which is helpful to ensure the uniformity of brightness of the pictures displayed by the array substrate.

It can be understood by the persons skilled in the art that the first positive power access end 14, the second positive power access end 15, the third positive power access end 16 and the fourth positive power access end 23 simultaneously transmit the positive voltage signal to the light-emitting elements of all sub-pixels in the array substrate, and only the second positive power access end 15 and the fourth positive power access end 23 are proximal to the light-emitting element in the central region such that the path through which the positive voltage signal transmitted from the second positive power access end 15 and the fourth positive power access end 23 to the light-emitting element in the central region passes is short, and the impedance is small.

Optionally, in the embodiment of the present disclosure, the array substrate further includes:
 a fourth negative power access end, located at the side of the positive power bus away from the display region and located between the first positive power access end and the third positive power access end, the fourth negative power access end being electrically connected to the negative power auxiliary line; and
 the fourth negative power access end is used to transmit the negative voltage signal to the light-emitting element through the negative power auxiliary line, the auxiliary electrode and the second electrode.

Figure 3:
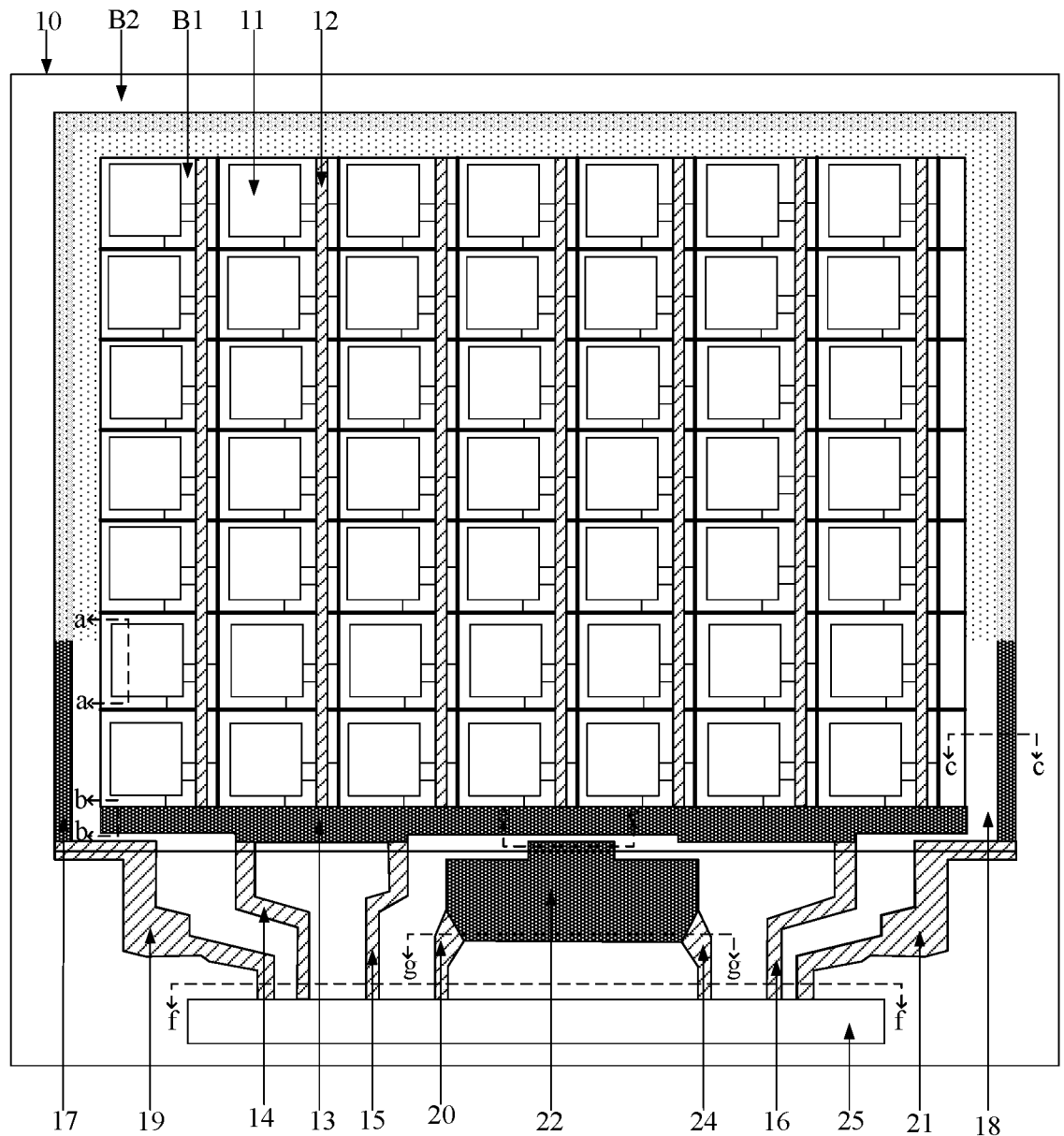
FIG. 3 is a front view of still another array substrate provided by an embodiment of the present disclosure.

Exemplarily, as shown in FIG. 3, on the basis of FIG. 1, the array substrate further includes:
 a fourth negative power access end 24, located at the side of the positive power bus 13 away from the display region B1 and located between the first positive power access end 14 and the third positive power access end 16; the fourth negative power access end 24 is electrically connected to the negative power auxiliary line 22; and the fourth negative power access end 24 is used to transmit the negative voltage signal to the light-emitting element through the negative power auxiliary line 22, the auxiliary electrode 18 and the second electrode.

For example, as shown in FIG. 3, the fourth negative power access end 24 is located between the second negative power access end 20 and the third positive power access end 16, and the fourth negative power access end 24 may be symmetric to the second negative power access end 20. The negative voltage signals on the fourth negative power access end 24 and the second negative power access end 20 may be transmitted, through the negative power auxiliary line 22 and the auxiliary electrode 18, to the light-emitting element in the central region (the central region of the placement position shown in FIG. 3). Therefore, the path through which the negative voltage signal transmitted from the negative power access end to the light-emitting element passes is short, and the signal transmission line for transmitting the negative voltage signal to the light-emitting element is short and has a small impedance, which is helpful to ensure the uniformity of brightness of the pictures displayed by the array substrate.

It can be understood by the persons skilled in the art that the first negative power access end 19, the second negative power access end 20, the third negative power access end 21 and the fourth negative power access end 24 simultaneously transmit the negative voltage signal to the light-emitting elements of all sub-pixels in the array substrate, and only the second negative power access end 20 and the fourth negative power access end 24 are proximal to the light-emitting element in the central region such that the path through which the negative voltage signal transmitted from the second negative power access end 20 and the fourth negative power access end 24 to the light-emitting element in the central region passes is short, and the impedance is small.

Optionally, in the embodiment of the present disclosure, the second negative power access end is located between the second positive power access end and the third positive power access end, and the array substrate further includes:

a fourth positive power access end and a fourth negative power access end, located at the side of the positive power bus away from the display region, the fourth positive power access end being located between the second negative power access end and the third positive power access end and electrically connected to the positive power bus, and the fourth negative power access end being located between the second negative power access end and the fourth positive power access end and electrically connected to the negative power auxiliary line; and the fourth positive power access end is used to transmit the positive voltage signal to the light-emitting element through the positive power bus, the positive power lines and the first electrode, and the fourth negative power access end is used to transmit the negative voltage signal to the light-emitting element through the negative power auxiliary line, the auxiliary electrode and the second electrode.

Figure 4:
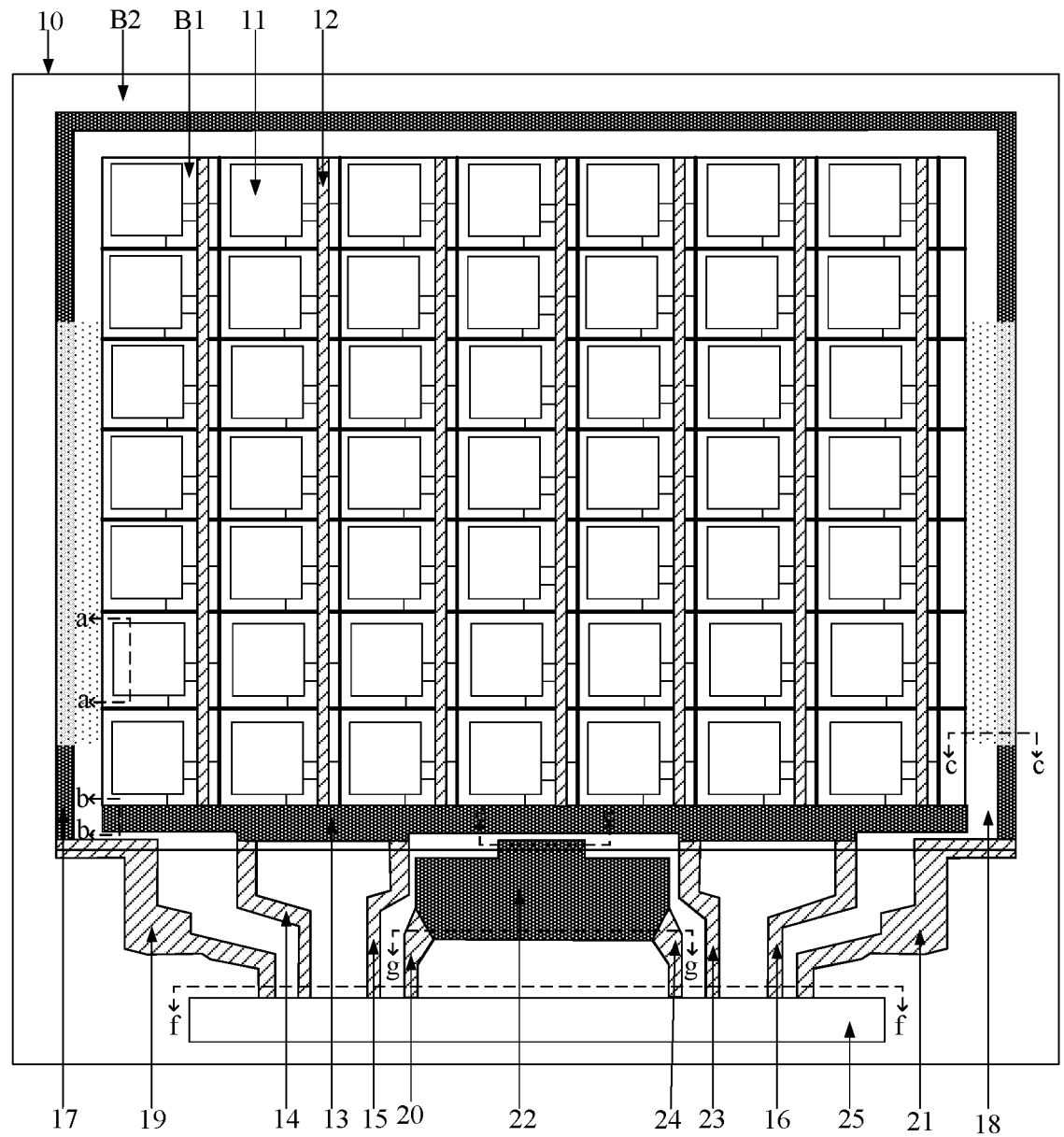
FIG. 4 is a front view of yet still another array substrate provided by an embodiment of the present disclosure.

Exemplarily, as shown in FIG. 4, on the basis of FIG. 1, the array substrate further includes:

a fourth positive power access end 23 and a fourth negative power access end 24, located at the side of the positive power bus 13 away from the display region B1, the fourth positive power access end 23 being located between the second negative power access end 20 and the third positive power access end 16 and electrically connected to the positive power bus 13, and the fourth negative power access end 24 being located between the second negative power access end 20 and the fourth positive power access end 23 and electrically connected to the negative power auxiliary line 22; and the fourth positive power access end 23 is used to transmit the positive voltage signal to the light-emitting element through the positive power bus 13, the positive power line 12 and the first electrode, and the fourth negative power access end 24 is used to transmit the negative voltage signal to the light-emitting element through the negative power auxiliary line 22, the auxiliary electrode 18 and the second electrode.

For example, as shown in FIG. 4, the fourth positive power access end 23 may be symmetric to the second positive power access end 15, and the fourth negative power access end 24 may be symmetric to the second negative power access end 20. The positive voltage signals on the fourth positive power access end 23 and the second positive power access end 15 may be transmitted, through the positive power bus 13 and the positive power line 12, to the light-emitting elements in the central region (the central region of the placement position shown in FIG. 4), and the negative voltage signals on the fourth negative power access end 24 and the second negative power access end 20 may be transmitted, through the negative power auxiliary line 22 and the auxiliary electrode 18, to light-emitting element in the central region (the central region of the placement position shown in FIG. 4). In this way, the path through which the positive voltage signal transmitted from the positive power access end to the light-emitting element passes is short, and the path through which the negative voltage signal transmitted from the negative power access end to the light-emitting element passes is short. Therefore, both the signal transmission line for transmitting the positive voltage signal to the light-emitting element and the signal transmission line for transmitting the negative voltage signal to the light-emitting element are short and have a small impedance, which is helpful to ensure the uniformity of brightness of the pictures displayed by the array substrate.

It can be understood by the persons skilled in the art that the first positive power access end 14, the second positive power access end 15, the third positive power access end 16 and the fourth positive power access end 23 simultaneously transmit the positive voltage signal to the light-emitting elements of all sub-pixels in the array substrate, the first negative power access end 19, the second negative power access end 20, the third negative power access end 21 and the fourth negative power access end 24 simultaneously transmit the negative voltage signal to the light-emitting elements of all sub-pixels in the array substrate, and only the second positive power access end 15 and the fourth positive power access end 23 are proximal to the light-emitting element in the central region such that the path through which the positive voltage signal transmitted from the second positive power access end 15 and the fourth positive power access end 23 to the light-emitting element in the central region passes is short and the impedance is small, and the second negative power access end 20 and the fourth negative power access end 24 are proximal to the light-emitting element in the central region such that the path through which the negative voltage signal transmitted from the second negative power access end 20 and the fourth negative power access end 24 to the light-emitting element in the central region passes is short and the impedance is small.

Optionally, in the embodiment of the present disclosure, the light-emitting element is an OLED, the first electrode serves as an anode, and the second electrode serves as a cathode.

Optionally, in the embodiment of the present disclosure, at least one of the sub-pixels includes a thin film transistor and a connecting electrode; and the thin film transistor includes an active layer located on the base substrate, a gate located at a side of the active layer away from the base substrate, and a source and a drain which are located at a side of the gate away from the base substrate.

Optionally, the positive power bus includes a first sublayer of the positive power bus and a second sublayer of the positive power bus, and the first sublayer of the positive power bus is electrically connected to the second sublayer of the positive power bus; and the first sublayer of the positive power bus and the source or the drain are located in the same layer, and the second sublayer of the positive power bus and the connecting electrode are located in the same layer.

Optionally, the first sublayer of the positive power bus is electrically connected to the second sublayer of the positive power bus through a positive power bus via hole.

Optionally, the negative power line includes a first sublayer of the negative power line and a second sublayer of the negative power line, and the first sublayer of the negative power line is electrically connected to the second sublayer of the negative power line;

the negative power auxiliary line includes a first sublayer of the negative power auxiliary line and a second sublayer of the negative power auxiliary line, and the first sublayer of the negative power auxiliary line is electrically connected to the second sublayer of the negative power auxiliary line; and the first sublayer of the negative power line and the first sublayer of the negative power auxiliary line are both located in the same layer with the source or the drain, and the second sublayer of the negative power line and the second sublayer of the negative power auxiliary line are both located in the same layer with the connecting electrode.

Optionally, the first sublayer of the negative power line is electrically connected to the second sublayer of the negative power line through a negative power line via hole, and the first sublayer of the negative power auxiliary line is electrically connected to the second sublayer of the negative power auxiliary line through a negative power auxiliary line via hole.

Figure 5:
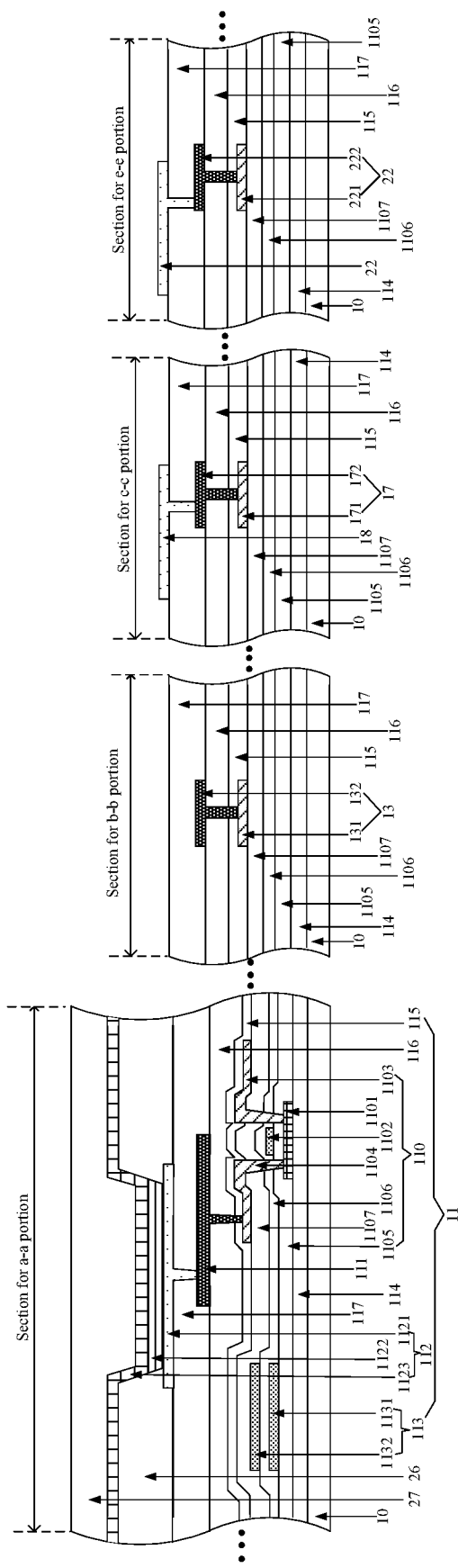
FIG. 5 is sectional views for an a-a portion, a b-b portion, a c-c portion and an e-e portion of an array substrate shown in any of FIG. 1 to FIG. 4.

Exemplarily, referring to FIG. 5, sectional views for an a-a portion, a b-b portion, a c-c portion and an e-e portion of an array substrate shown in any of FIG. 1 to FIG. 4 are illustrated. Referring to FIG. 5, at least one of the sub-pixels 11 includes a thin film transistor 110 and a connecting electrode 111; and the thin film transistor 110 includes an active layer 1101 located on the base substrate 10, a gate 1102 located at a side of the active layer 1101 away from the base substrate 10, and a source 1103 and a drain 1104 which are located at a side of the gate 1102 away from the base substrate 10. The source 1103 and the drain 1104 may be located in the same layer.

The positive power bus 13 includes a first sublayer of the positive power bus 131 and a second sublayer of the positive power bus 132; the first sublayer of the positive power bus 131 is electrically connected to the second sublayer of the positive power bus 132 through a positive power bus via hole (not labeled in FIG. 5); the first sublayer of the positive power bus 131 and the source 1103 or the drain 1104 are located in the same layer; and the second sublayer of the positive power bus 132 and the connecting electrode 111 are located in the same layer. A plurality of positive power bus via holes are provided; and the first sublayer of the positive power bus 131 is electrically connected to the second sublayer of the positive power bus 132 through the plurality of positive power bus via holes to ensure the reliability of the connection.

The negative power line 17 includes a first sublayer of the negative power line 171 and a second sublayer of the negative power line 172, and the first sublayer of the negative power line 171 is electrically connected to the second sublayer of the negative power line 172 through a negative power line via hole (not labeled in FIG. 5); the negative power auxiliary line 22 includes a first sublayer of the negative power auxiliary line 221 and a second sublayer of the negative power auxiliary line 222, and the first sublayer of the negative power auxiliary line 221 is electrically connected to the second sublayer of the negative power auxiliary line 222 through a negative power auxiliary line via hole; the first sublayer of the negative power line 171 and the first sublayer of the negative power auxiliary line 221 are both located in the same layer with the source 1103 or the drain 1104, and the second sublayer of the negative power line 172 and the second sublayer of the negative power auxiliary line 222 are both located in the same layer with the connecting electrode 111. A plurality of negative power line via holes and a plurality of negative power auxiliary line via holes are provided; the first sublayer of the negative power line 171 is electrically connected to the second sublayer of the negative power line 172 through the plurality of negative power line via holes to ensure the reliability of the connection; and the first sublayer of the negative power auxiliary line 221 is electrically connected to the second sublayer of the negative power auxiliary line 222 through the plurality of negative power auxiliary line via holes to ensure the reliability of the connection.

Optionally, in the embodiment of the present disclosure, the auxiliary electrode is located at a side of the negative power line away from the base substrate, and the auxiliary electrode is electrically connected to the negative power auxiliary line through a negative power auxiliary via hole.

Exemplarily, as shown in FIG. 5, the auxiliary electrode 18 is located at a side of the negative power line 17 away from the base substrate 10, and the auxiliary electrode 18 is electrically connected to the negative power auxiliary line 22 through a negative power auxiliary via hole. For example, the auxiliary electrode 18 is electrically connected to the second sublayer of the negative power auxiliary line 222 through the negative power auxiliary via hole. A plurality of negative power auxiliary via holes may be provided. The auxiliary electrode 18 is electrically connected to the second sublayer of the negative power auxiliary line 222 through the plurality of negative power auxiliary via holes to ensure the reliability of the connection.

Optionally, in the embodiment of the present disclosure, the auxiliary electrode is located at a side of the negative power line away from the base substrate, and the auxiliary electrode is electrically connected to the negative power line through a negative power auxiliary via hole.

Exemplarily, as shown in FIG. 5, the auxiliary electrode 18 is located at a side of the negative power line 17 away from the base substrate 10, and the auxiliary electrode 18 is electrically connected to the negative power line 17 through a negative power auxiliary via hole. For example, the auxiliary electrode 18 is electrically connected to the second sublayer of the negative power line 172 through the negative power auxiliary via hole. A plurality of negative power auxiliary via holes may be provided. The auxiliary electrode 18 is electrically connected to the second sublayer of the negative power line 172 through the plurality of negative power auxiliary via holes to ensure the reliability of the connection.

It can be understood by the persons skilled in the art that the negative power auxiliary via hole for connecting the auxiliary electrode 18 to the second sublayer of the negative power auxiliary line 222 is a via hole located on an insulating layer between the auxiliary electrode 18 and the second sublayer of the negative power auxiliary line 222, the negative power auxiliary via hole for connecting the auxiliary electrode 18 to the second sublayer of the negative power line 172 is a via hole located on an insulating layer between the auxiliary electrode 18 and the second sublayer of the negative power line 172, and the negative power auxiliary via hole for connecting the auxiliary electrode 18 to the second sublayer of the negative power auxiliary line 222 and the negative power auxiliary via hole for connecting the auxiliary electrode 18 to the second sublayer of the negative power line 172 are different via holes.

Optionally, in the embodiment of the present disclosure, at least one of the sub-pixels includes a thin film transistor; the thin film transistor includes an active layer located on the base substrate, a gate located at a side of the active layer away from the base substrate, and a source and a drain which are located at a side of the gate away from the base substrate; the first positive power access end, the second positive power access end and the third positive power access end are located in the same layer with the source or the drain; and the first negative power access end, the second negative power access end and the third negative power access end are located in the same layer with the source or the drain.

Figure 6:
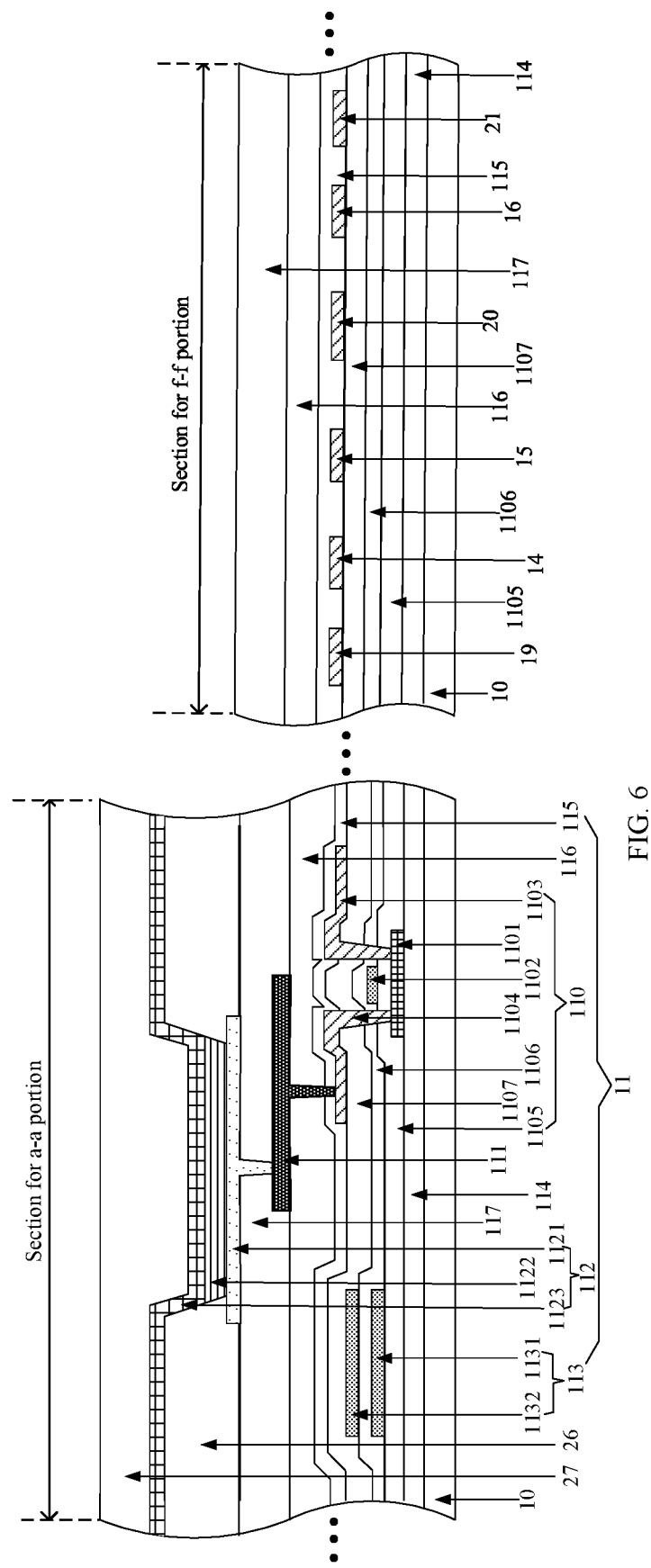
FIG. 6 is a sectional view for an a-a portion and an f-f portion of an array substrate shown in FIG. 1.

Exemplarily, referring to FIG. 6, sectional views for an a-a portion and an f-f portion of an array substrate shown in FIG. 1 are illustrated. Referring to FIG. 6, at least one of the sub-pixels 11 includes a thin film transistor 110; the thin film transistor 110 includes an active layer 1101 located on the base substrate 10, a gate 1102 located at a side of the active layer 1101 away from the base substrate 10, and a source 1103 and a drain 1104 which are located at a side of the gate 1102 away from the base substrate 10; the first positive power access end 14, the second positive power access end 15 and the third positive power access end 16 are located in the same layer with the source 1103 or the drain 1104; and the first negative power access end 19, the second negative power access end 20 and the third negative power access end 21 are located in the same layer with the source 1103 or the drain 1104.

Optionally, in the embodiment of the present disclosure, when the array substrate further includes the fourth positive power access end and/or the fourth negative power access end, the fourth positive power access end and/or the fourth negative power access end are located in the same layer with the source or the drain.

Figure 7:
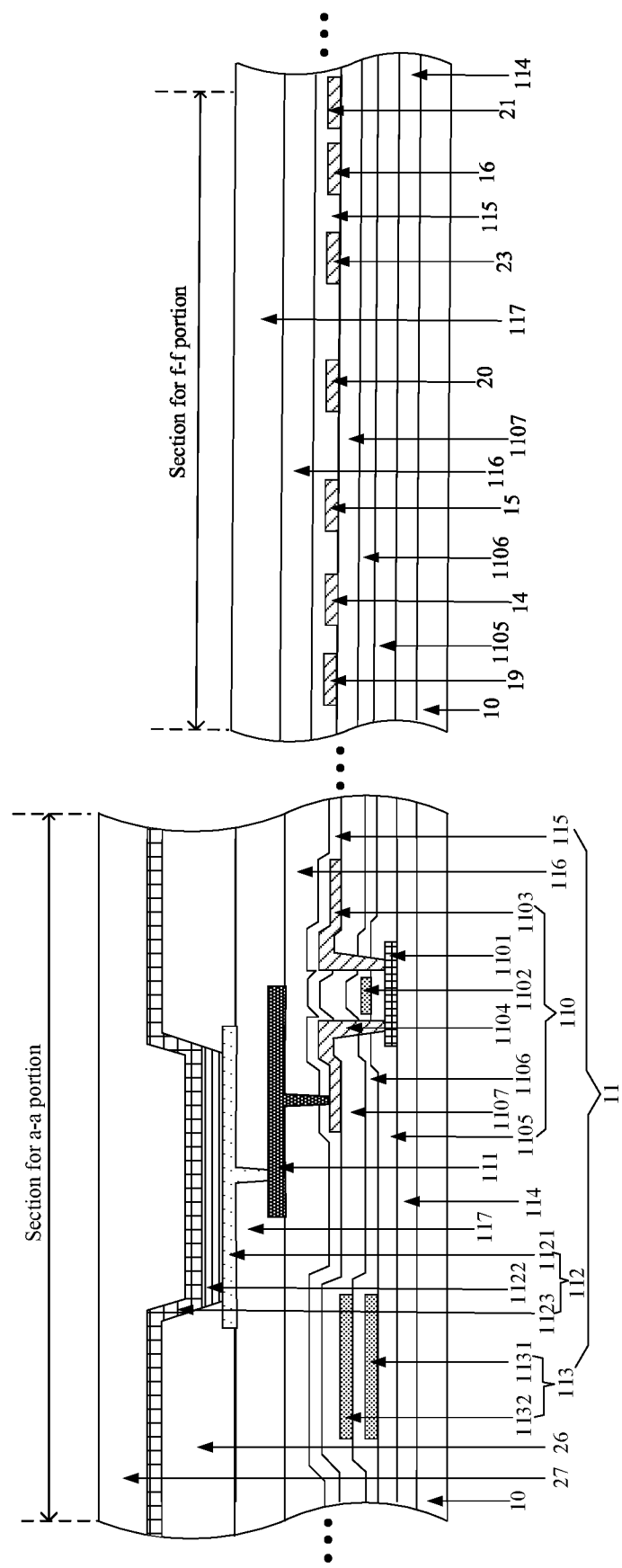
FIG. 7 is a sectional view for an a-a portion and an f-f portion of an array substrate shown in FIG. 2.

Exemplarily, referring to FIG. 7, sectional views for an a-a portion and an f-f portion of an array substrate shown in FIG. 2 are illustrated. Referring to FIG. 7, the first positive power access end 14, the second positive power access end 15, the third positive power access end 16 and the fourth positive power access end 23 are located in the same layer with the source 1103 or the drain 1104; and the first negative power access end 19, the second negative power access end 20, the third negative power access end 21 are located in the same layer with the source 1103 or the drain 1104.

Figure 8:
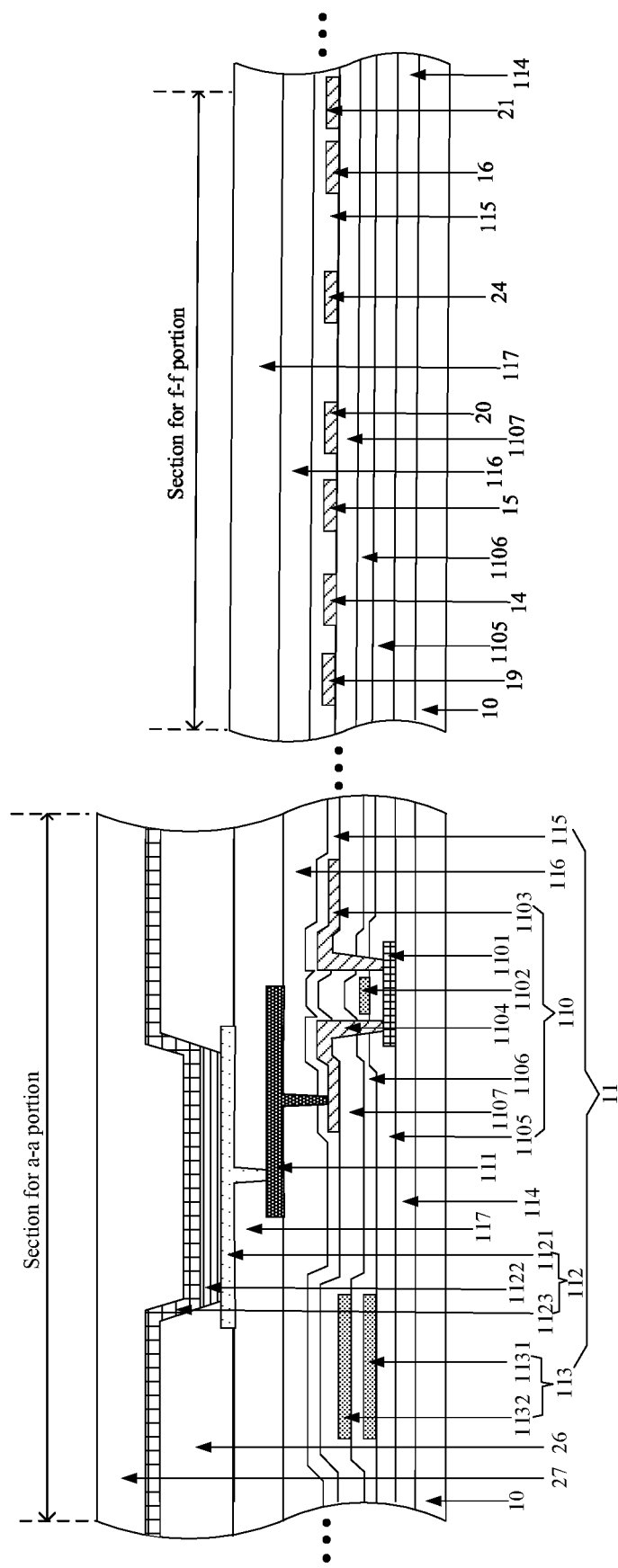
FIG. 8 is a sectional view for an a-a portion and an f-f portion of an array substrate shown in FIG. 3.

Exemplarily, referring to FIG. 8, sectional views for an a-a portion and an f-f portion of an array substrate shown in FIG. 3 are illustrated. Referring to FIG. 8, the first positive power access end 14, the second positive power access end 15 and the third positive power access end 16 are located in the same layer with the source 1103 or the drain 1104; and the first negative power access end 19, the second negative power access end 20, the third negative power access end 21 and the fourth negative power access end 24 are located in the same layer with the source 1103 or the drain 1104.

Figure 9:
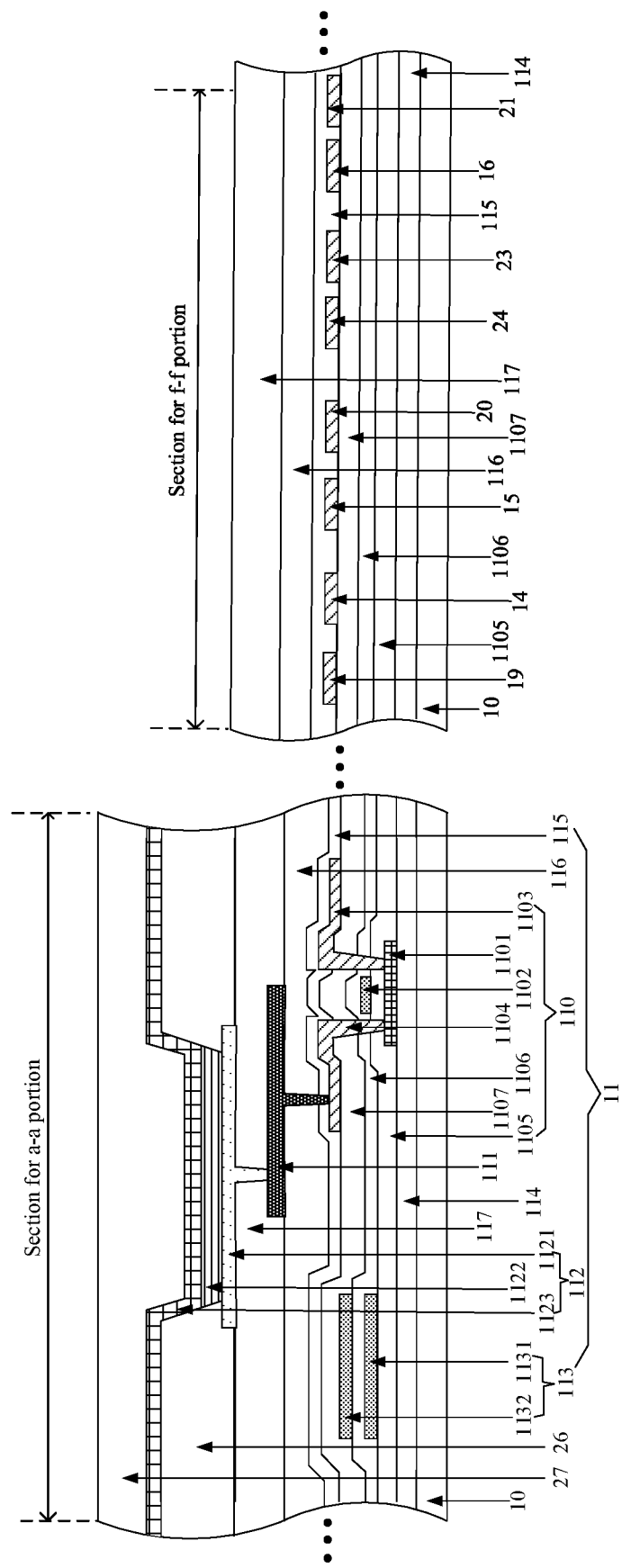
FIG. 9 is a sectional view for an a-a portion and an f-f portion of an array substrate shown in FIG. 4.

Exemplarily, referring to FIG. 9, sectional views for an a-a portion and an f-f portion of an array substrate shown in FIG. 4 are illustrated. Referring to FIG. 9, the first positive power access end 14, the second positive power access end 15, the third positive power access end 16 and the fourth positive power access end 23 are located in the same layer with the source 1103 or the drain 1104; and the first negative power access end 19, the second negative power access end 20, the third negative power access end 21 and the fourth negative power access end 24 are located in the same layer with the source 1103 or the drain 1104.

Optionally, in the embodiment of the present disclosure, the negative power auxiliary line includes a first sublayer of the negative power auxiliary line and a second sublayer of the negative power auxiliary line, and the first sublayer of the negative power auxiliary line is electrically connected to the second sublayer of the negative power auxiliary line; and the second negative power access end, the fourth negative power access end and the first sublayer of the negative power auxiliary line are of an integral structure.

Figure 10:
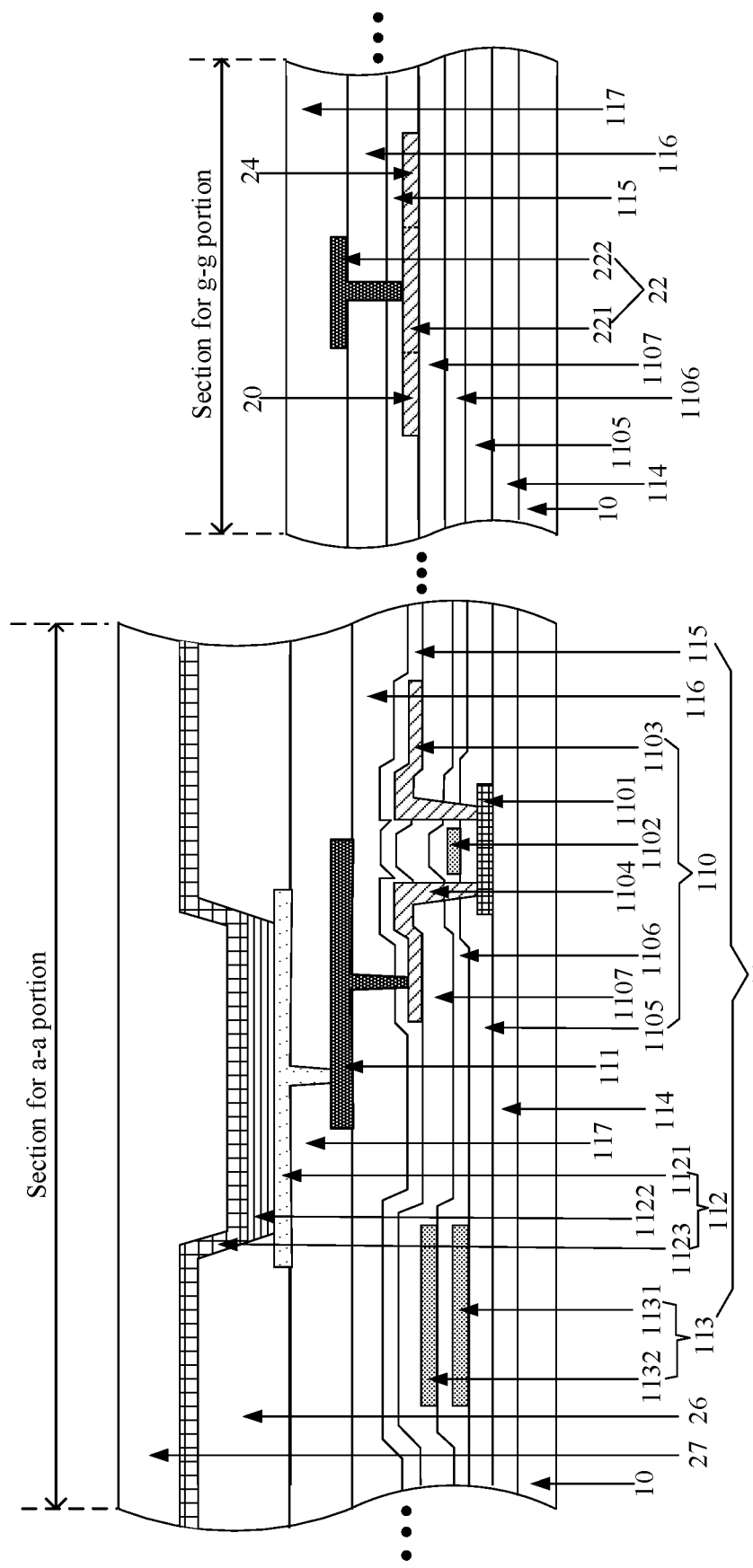
FIG. 10 is a sectional view for an a-a portion and a g-g portion of an array substrate shown in FIG. 3 or FIG. 4.

Exemplarily, referring to FIG. 10, sectional views for an a-a portion and a g-g portion of an array substrate shown in FIG. 3 or FIG. 4 are illustrated. Referring to FIG. 10, the negative power auxiliary line 22 includes a first sublayer of the negative power auxiliary line 221 and a second sublayer of the negative power auxiliary line 222, and the first sublayer of the negative power auxiliary line 221 is electrically connected to the second sublayer of the negative power auxiliary line 222 through a negative power auxiliary line via hole (not labeled in FIG. 10); and the second negative power access end 20, the fourth negative power access end 24 and the first sublayer of the negative power auxiliary line 221 are of an integral structure.

It is to be noted that FIG. 10 takes that the array substrate simultaneously includes the second negative power access end 20 and the fourth negative power access end 24 as the example for description. When the array substrate only includes the second negative power access end 20 or the fourth negative power access end 24, the second negative power access end 20 or the fourth negative power access end 24 and the first sublayer of the negative power auxiliary line 221 are of the integral structure. For example, when the array substrate includes the second negative power access end 20 rather than the fourth negative power access end 24, the second negative power access end 20 and the first sublayer of the negative power auxiliary line 221 are of the integral structure; and when the array substrate includes the fourth negative power access end 24 rather than the second negative power access end 20, the fourth negative power access end 24 and the first sublayer of the negative power auxiliary line 221 are of the integral structure.

Optionally, in the embodiment of the present disclosure, the array substrate further includes: a circuit board, located at sides, away from the display region, of the first positive power access end, the second positive power access end, the third positive power access end, the fourth positive power access end, the first negative power access end, the second negative power access end, the third negative power access end and the fourth negative power access end, the first positive power access end, the second positive power access end, the third positive power access end, the fourth positive power access end, the first negative power access end, the second negative power access end, the third negative power access end and the fourth negative power access end being respectively and electrically connected to the circuit board.

Exemplarily, as shown in FIG. 1, the array substrate further includes: a circuit board 25, located at sides, away from the display region B1, of the first positive power access end 14, the second positive power access end 15, the third positive power access end 16, the first negative power access end 19, the second negative power access end 20 and the third negative power access end 21; and the first positive power access end 14, the second positive power access end 15, the third positive power access end 16, the first negative power access end 19, the second negative power access end 20 and the third negative power access end 21 are respectively and electrically connected to the circuit board 25.

Exemplarily, as shown in FIG. 2, the array substrate further includes: a circuit board 25, located at sides, away from the display region B1, of the first positive power access end 14, the second positive power access end 15, the third positive power access end 16, the fourth positive power access end 23, the first negative power access end 19, the second negative power access end 20 and the third negative power access end 21; and the first positive power access end 14, the second positive power access end 15, the third positive power access end 16, the fourth positive power access end 23, the first negative power access end 19, the second negative power access end 20 and the third negative power access end 21 are respectively and electrically connected to the circuit board 25.

Exemplarily, as shown in FIG. 3, the array substrate further includes: a circuit board 25, located at sides, away from the display region B1, of the first positive power access end 14, the second positive power access end 15, the third positive power access end 16, the first negative power access end 19, the second negative power access end 20, the third negative power access end 21 and the fourth negative power access end 24; and the first positive power access end 14, the second positive power access end 15, the third positive power access end 16, the first negative power access end 19, the second negative power access end 20, the third negative power access end 21 and the fourth negative power access end 24 are respectively and electrically connected to the circuit board 25.

Exemplarily, as shown in FIG. 4, the array substrate further includes: a circuit board 25, located at sides, away from the display region B1, of the first positive power access end 14, the second positive power access end 15, the third positive power access end 16, the fourth positive power access end 23, the first negative power access end 19, the second negative power access end 20, the third negative power access end 21 and the fourth negative power access end 24; and the first positive power access end 14, the second positive power access end 15, the third positive power access end 16, the fourth positive power access end 23, the first negative power access end 19, the second negative power access end 20, the third negative power access end 21 and the fourth negative power access end 24 are respectively and electrically connected to the circuit board 25.

It is to be noted that the circuit board 25 in the embodiment of the present disclosure may be a Flexible Printed Circuit (FPC).

Exemplarily, as shown in FIG. 5 to FIG. 10, at least one of the sub-pixels 11 includes a thin film transistor 110, a connecting electrode 111, a light-emitting element 112 and a storage capacitor 113. The thin film transistor 110 includes an active layer 1101 located on the base substrate 10, a first insulating layer 1105 located at a side of the active layer 1101 away from the base substrate 10, a gate 1102 located at a side of the first insulating layer 1105 away from the base substrate 10, a second insulating layer 1106 located at a side of the gate 1102 away from the base substrate 10, a third insulating layer 1107 located at a side of the second insulating layer 1106 away from the base substrate 10, and a source 1103 and a drain 1104 which are located at a side of the third insulating layer 1107 away from the base substrate 10. The connecting electrode 111 is located at a side of the thin film transistor 110 away from the base substrate 10. The connecting electrode 111 is electrically connected to the drain 1104. The light-emitting element 112 is located at a side of the connecting electrode 111 away from the base substrate. The light-emitting element 112 includes a first electrode 1121, a light-emitting layer 1122 and a second electrode 1123 which are sequentially stacked along a direction away from the base substrate 10. The first electrode 1121 is electrically connected to the connecting electrode 111. The storage capacitor 113 includes a first polar plate 1131 and a second polar plate 1132. The first polar plate 1131 and the gate 1101 are located in the same layer. The second polar plate 1132 is located between the second insulating layer 1106 and the third insulating layer 1107.

Exemplarily, as shown in FIG. 5 to FIG. 10, at least one of the sub-pixels 11 further includes a buffer layer 114 located between the active layer 1101 and the base substrate 10, a passivation layer 115 and a first planarization layer 116 located between the source 1103 and the connecting electrode 111 along a direction away from the base substrate 10, and a second planarization layer 117 located between the connecting electrode 111 and the first electrode 1121. A via hole is respectively provided on the passivation layer 115 and the first planarization layer 116. The connecting electrode 111 is electrically connected to the drain 1104 through the via holes on the passivation layer 115 and the first planarization layer 116. A via hole is provided on the second planarization layer 117. The first electrode 1121 is electrically connected to the connecting electrode 111 through the via hole on the second planarization layer 117.

Optionally, as shown in FIG. 5 to FIG. 10, the array substrate further includes: a pixel defining layer 26 located at a side of the second planarization layer 117 away from the base substrate 10, the pixel defining layer 26 including an aperture region defined by a retaining wall structure, and the light-emitting element 112 being located in the aperture region of the pixel defining layer 26; and a packaging structure 27 located at a side of the light-emitting element 112 away from the base substrate, the packaging structure 27 being used to package the light-emitting element 112.

It is to be noted that in the b-b portion, the c-c portion, the e-e portion, the f-f portion and the g-g portion in FIG. 5 to FIG. 10, the first insulating layer 1105, the second insulating layer 1106, the third insulating layer 1107, the buffer layer 114, the planarization layer 115, the passivation layer 115, the first planarization layer 116 and the second planarization layer 117 may be portions where the first insulating layer 1105, the second insulating layer 1106, the third insulating layer 1107, the buffer layer 114, the planarization layer 115, the passivation layer 115, the first planarization layer 116 and the second planarization layer 117 on the a-a portion respectively extend to the peripheral region B2. It can be understood by the persons skilled in the art that in the b-b portion, the c-c portion, the e-e portion, the f-f portion and the g-g portion in FIG. 5 to FIG. 10, only the positive power line 13, the first positive power access end 14, the second positive power access end 15 and the third positive power access end 16, the negative power line 17, the auxiliary electrode 18, the first negative power access end 19, the second negative power access end 20, the third negative power access end 21, the negative power auxiliary line 22, the fourth positive power access end 23 and the fourth negative power access end 24 are illustrated. The peripheral region of the array substrate may further include other circuit structures which are not illustrated in FIG. 5 to FIG. 10.

It is further to be noted that except for the structure described in the present disclosure, the array substrate may further include other structures. For example, the array substrate further includes a plurality of gate lines having the same extension direction, and a plurality of data lines having the same extension direction. The plurality of gate lines and the plurality of data lines are intersected to define a plurality of pixel regions. The plurality of sub-pixels is located in the plurality of pixel regions in one-to-one correspondence. Also for example, the array substrate may further include a Chip On Film (COF) and an Integrated Circuit (IC), etc., which is not elaborated herein in the embodiment of the present disclosure.

In summary, according to the array substrate provided by the embodiment of the present disclosure, the array substrate includes the first positive power access end, the second positive power access end, the third positive power access end, the first negative power access end, the second negative power access end and the third negative power access end, both the second positive power access end and the second negative power access end are located between the first positive power access end and the third positive power access end, each positive power access end may transmit the positive voltage signal to the light-emitting element of the proximal sub-pixel thereof through the positive power bus and the positive power line, and each negative power access end may transmit the negative voltage signal to the light-emitting element of the proximal sub-pixel thereof through the negative power line, the negative power auxiliary line and the auxiliary electrode; and therefore, both the signal transmission line for transmitting the positive voltage signal to the light-emitting element and the signal transmission line for transmitting the negative voltage signal to the light-emitting element are short and have the small impedance, which is helpful to ensure the uniformity of brightness of the pictures displayed by the array substrate.

Based on the same inventive concept, an embodiment of the present disclosure further provides a display device, including the above any array substrate. The display device provided by embodiment of the present disclosure may be any product or part with a display function, such as a mobile phone, a tablet computer, a television, a display, a notebook computer, a digital photo frame, a navigator, etc.

In the embodiments of the present invention, the term "the same layer" refers to a relationship through which the layers are formed simultaneously in the same step. For example, when the second sublayer of the negative power auxiliary line 222 and the connecting electrode 111 are formed as a result of one or more step of the same patterning treatment performed in the same layer of material, both are located in the same layer. In another example, the second sublayer of the negative power auxiliary line 222 and the connecting electrode 111 may be formed in the same layer by simultaneously executing the step for forming the second sublayer of the negative power auxiliary line 222 and the step for forming the connecting electrode 111. The "the same layer" does not always refer to that the layer thickness or the layer height is the same in the sectional view.

The terms "first", "second", "third", "fourth", and similar words used in the embodiments of the present disclosure do not indicate any sequence, quantity, or importance, but are merely used to distinguish different constituent parts. The term "electrical connection" between two conductors refers to direct or indirect electrical connection between the two conductors, and the two conductors can transmit the electrical signal. The term "at least one" refers to one or more, and the term "a plurality of" refers to two or more.

In the embodiments of the present disclosure, the term "and/or" merely describes the association relationship between the associated objects and indicates that there may be three relationships. For example, A and/or B may indicate three cases where only A exists, A and B exist at the same time, or only B exists. In addition, the character "/" in this specification generally indicates that the related objects are in an "or" relationship.

It is to be noted that in the accompanying drawings, for the clarity of the illustration, the dimensions of a part or all of layers or a part or all of regions may be scaled up. It may be understood that when an element or a layer is referred to as being "on" another element or layer, it may be directly on the other element or an intervening layer may be present therebetween. Besides, it may be understood that when an element or a layer is referred to as being "under" another element or layer, it may be directly on the other element, or more than one intervening layer or element may be present therebetween. Additionally, it may further be understood that when an element or a layer is referred to as being "between" two layers or two elements, it may be a unique layer between the two layers or two elements, or more than one intervening layer or element may be present therebetween. The similar reference sign refers to the similar element throughout the specification.

The above are merely exemplary embodiments of the present disclosure and are not intended to limit the present application. Any modifications, equivalent substitutions, improvements and the like made within the spirits and principles of the present disclosure should be included in the protection scope of the present disclosure.

What is claimed is:

1. An array substrate, comprising:
 a base substrate, comprising a display region and a peripheral region surrounding the display region, the display region comprising a first boundary, a second boundary, a third boundary and a fourth boundary;
 a plurality of sub-pixels, in the display region, at least one of the sub-pixels comprising a light-emitting element, and the light-emitting element comprising a first electrode, a light-emitting layer and a second electrode which are stacked;
 a plurality of positive power lines, in the display region and electrically connected to the plurality of sub-pixels;
 a positive power bus, in the peripheral region and extending along the first boundary, the positive power bus being electrically connected to the plurality of positive power lines;
 a first positive power access end, a second positive power access end and a third positive power access end, in a portion of the peripheral region at a side of the positive power bus away from the display region, the second positive power access end being between the first positive power access end and the third positive power access end, and the first positive power access end, the second positive power access end and the third positive power access end being respectively and electrically connected to the positive power bus;
 a negative power line, in the peripheral region and surrounding the second boundary, the third boundary and the fourth boundary;
 an auxiliary electrode, in the peripheral region and surrounding the first boundary, the second boundary, the third boundary and the fourth boundary, the auxiliary electrode being respectively and electrically connected to the negative power line and the second electrode;
 a first negative power access end, a second negative power access end, a third negative power access end and a fourth negative power access end, in the portion of the peripheral region at the side of the positive power bus away from the display region, the first negative power access end being at a side of the first positive power access end away from the second positive power access end, the second negative power access end being between the first positive power access end and the third positive power access end, the third negative power access end being at a side of the third positive power access end away from the second positive power access end, the fourth negative power access end being between the second negative power access end and the third positive power access end, and the first negative power access end and the third negative power access end being respectively and electrically connected to the negative power line; and a negative power auxiliary line, in the peripheral region, between the second negative power access end and the fourth negative power access end in a first direction, and between the positive power bus and the second negative power access end in a second direction, one end of the negative power auxiliary line is connected to the second negative power access end, another end of the negative power auxiliary line is connected to the fourth negative power access end, and the first direction intersecting with the second direction;

wherein the negative power auxiliary line is electrically connected to the auxiliary electrode, and an orthographic projection of the negative power auxiliary line on the base substrate at least partially overlaps with an orthographic projection of the auxiliary electrode on the base substrate.

2. The array substrate according to claim 1, wherein
the first positive power access end, the second positive power access end and the third positive power access end are used to transmit a positive voltage signal to the first electrode of the light-emitting element through the positive power bus and the positive power lines;
the first negative power access end and the third negative power access end are used to transmit a negative voltage signal to the second electrode of the light-emitting element through the negative power line and the auxiliary electrode; and
the second negative power access end and the fourth negative power access end are used to transmit a negative voltage signal to the second electrode of the light-emitting element through the negative power auxiliary line and the auxiliary electrode.

3. The array substrate according to claim 1, wherein the array substrate further comprises:
a fourth positive power access end, in the portion of the peripheral region at the side of the positive power bus away from the display region and between the fourth negative power access end and the third positive power access end, the fourth positive power access end being electrically connected to the positive power bus; and
the fourth positive power access end is used to transmit the positive voltage signal to the first electrode of the light-emitting element through the positive power bus and the positive power lines.

4. The array substrate according to claim 3, wherein at least one of following pairs are symmetric with respect to the negative power auxiliary line:
the first positive power access end and the third positive power access end;
the first negative power access end and the third negative power access end;
the second positive power access end and the fourth positive power access end; and
the second negative power access end and the fourth negative power access end.

5. The array substrate according to claim 3, wherein the positive power bus and at least one of the first positive power access end, the second positive power access end, the third positive power access end and the fourth positive power access end are of an integral structure.

6. The array substrate according to claim 3, wherein at least one of the first positive power access end, the second positive power access end, the third positive power access end, the fourth positive power access end, the first negative power access end, the second negative power access end, the third negative power access end and the fourth negative power access end is at a right angle with the positive power bus.

7. The array substrate according to claim 3, wherein a shape of an orthographic projection of at least one of the first positive power access end, the second positive power access end, the third positive power access end, the fourth positive power access end, the first negative power access end, the second negative power access end, the third negative power access end and the fourth negative power access end on the base substrate is a bending line.

8. The array substrate according to claim 3, wherein
the light-emitting element is an organic light emitting diode, the first electrode serves as an anode, and the second electrode serves as a cathode;
at least one of the sub-pixels comprises a thin film transistor;
the thin film transistor comprises an active layer on the base substrate, a gate at a side of the active layer away from the base substrate, and a source and a drain which are at a side of the gate away from the base substrate; and
the first positive power access end, the second positive power access end, the third positive power access end and the fourth positive power access end are all in the same layer with one of the source and the drain.

9. The array substrate according to claim 3, wherein the array substrate further comprises:
a circuit board, in a portion of the peripheral region at sides, away from the display region, of the first positive power access end, the second positive power access end, the third positive power access end, the fourth positive power access end, the first negative power access end, the second negative power access end, the third negative power access end and the fourth negative power access end, wherein the first positive power access end, the second positive power access end, the third positive power access end, the fourth positive power access end, the first negative power access end, the second negative power access end, the third negative power access end and the fourth negative power access end are respectively and electrically connected to the circuit board.

10. The array substrate according to claim 1, wherein the first negative power access end, the third negative power access end and the negative power line are of an integral structure; or, the negative power auxiliary line, the second negative power access end and the fourth negative power access end are of an integral structure.

11. The array substrate according to claim 1, wherein a shape of the auxiliary electrode is a closed ring, and the auxiliary electrode surrounds the display region.

12. The array substrate according to claim 1, wherein
at least one of the sub-pixels comprises a thin film transistor and a connecting electrode; and
the thin film transistor comprises an active layer on the base substrate, a gate at a side of the active layer away from the base substrate, and a source and a drain which are at a side of the gate away from the base substrate.

13. The array substrate according to claim 12, wherein
the positive power bus comprises a first sublayer of the positive power bus and a second sublayer of the positive power bus, and the first sublayer of the positive power bus is electrically connected to the second sublayer of the positive power bus; and the first sublayer of the positive power bus and one of the source and the drain are in the same layer, and the second sublayer of the positive power bus and the connecting electrode are in the same layer.

14. The array substrate according to claim 13, wherein the first sublayer of the positive power bus is electrically connected to the second sublayer of the positive power bus through a positive power bus via hole.

15. The array substrate according to claim 12, wherein the negative power line comprises a first sublayer of the negative power line and a second sublayer of the negative power line, and the first sublayer of the negative power line is electrically connected to the second sublayer of the negative power line;

the negative power auxiliary line comprises a first sublayer of the negative power auxiliary line and a second sublayer of the negative power auxiliary line, and the first sublayer of the negative power auxiliary line is electrically connected to the second sublayer of the negative power auxiliary line; and the first sublayer of the negative power line and the first sublayer of the negative power auxiliary line are both in the same layer with one of the source and the drain, and the second sublayer of the negative power line and the second sublayer of the negative power auxiliary line are both in the same layer with the connecting electrode.

16. The array substrate according to claim 15, wherein the first sublayer of the negative power line is electrically connected to the second sublayer of the negative power line through a negative power line via hole, and the first sublayer of the negative power auxiliary line is electrically connected to the second sublayer of the negative power auxiliary line through a negative power auxiliary line via hole; and the first direction is a direction extending along a long side of the base substrate, the second is a direction extending along a short side of the base substrate, and the first direction is perpendicular to the second direction.

17. The array substrate according to claim 1, wherein at least one of the sub-pixels comprises a thin film transistor;

the thin film transistor comprises an active layer on the base substrate, a gate at a side of the active layer away from the base substrate, and a source and a drain which are at a side of the gate away from the base substrate; and the first negative power access end, the second negative power access end, the third negative power access end and the fourth negative power access end are all in the same layer with one of the source and the drain.

18. The array substrate according to claim 1, wherein the negative power auxiliary line comprises a first sublayer of the negative power auxiliary line and a second sublayer of the negative power auxiliary line, the first sublayer of the negative power auxiliary line is electrically connected to the second sublayer of the negative power auxiliary line, and the second sublayer of the negative power auxiliary line is at a side of the first sublayer of the negative power auxiliary line away from the base substrate; and the second negative power access end, the fourth negative power access end and the first sublayer of the negative power auxiliary line are of an integral structure.

19. The array substrate according to claim 1, wherein the auxiliary electrode is at a side of the negative power line away from the base substrate, and the auxiliary electrode is electrically connected to the negative power auxiliary line through a negative power auxiliary via hole.

20. A display device, comprising the array substrate according to claim 1.

* * * * *